United States Patent
Athanasiou et al.

(10) Patent No.: US 12,116,676 B2
(45) Date of Patent: Oct. 15, 2024

(54) IN-SITU STEAM GENERATED OXYNITRIDE

(71) Applicants: Sotirios Athanasiou, Corbeil-Essonnes (FR); Laurence Vallier, Chevilly-Larue (FR)

(72) Inventors: Sotirios Athanasiou, Corbeil-Essonnes (FR); Laurence Vallier, Chevilly-Larue (FR)

(73) Assignee: X-FAB FRANCE SAS, Corbeil-Essonnes (FR)

( * ) Notice: Subject to any disclaimer, the term of this patent is extended or adjusted under 35 U.S.C. 154(b) by 164 days.

(21) Appl. No.: 17/228,190

(22) Filed: Apr. 12, 2021

(65) Prior Publication Data
US 2021/0317559 A1    Oct. 14, 2021

(30) Foreign Application Priority Data

Apr. 14, 2020 (GB) ........................ 2005434

(51) Int. Cl.
*C23C 8/34* (2006.01)
*C23C 8/02* (2006.01)
*H01L 21/02* (2006.01)

(52) U.S. Cl.
CPC ............ *C23C 8/34* (2013.01); *C23C 8/02* (2013.01); *H01L 21/02249* (2013.01); *H01L 21/02255* (2013.01)

(58) Field of Classification Search
None
See application file for complete search history.

(56) References Cited

U.S. PATENT DOCUMENTS

| | | | |
|---|---|---|---|
| 2001/0016428 A1* | 8/2001 | Smith | H01L 21/76801 438/748 |
| 2002/0146914 A1 | 10/2002 | Huang et al. | |
| 2004/0175900 A1* | 9/2004 | Lin | H01L 21/76232 257/E21.549 |
| 2007/0231757 A1* | 10/2007 | Dip | C30B 31/16 431/174 |
| 2009/0221120 A1 | 9/2009 | Luo et al. | |
| 2015/0017814 A1* | 1/2015 | Zhang | H01L 21/28185 438/766 |

(Continued)

FOREIGN PATENT DOCUMENTS

| | | | | |
|---|---|---|---|---|
| CN | 103972070 A | * | 8/2014 | ....... H01L 21/28202 |
| WO | 2006/107703 | | 10/2006 | |

OTHER PUBLICATIONS

An English Translation of CN 103972070 A (Year: 2014).*

(Continued)

*Primary Examiner* — Khaja Ahmad
(74) *Attorney, Agent, or Firm* — Thompson Hine LLP

(57) ABSTRACT

A method of forming an oxide layer in an in-situ steam generation (ISSG) process, including providing a silicon substrate in a rapid thermal process (RTP) chamber and injecting a gas mixture into the RTP chamber. The method further includes heating a surface of the silicon substrate to a reaction temperature, so that the gas mixture reacts close to the surface to form steam and thereby oxidize the silicon substrate to form the oxide layer on the surface, and wherein the gas mixture comprises hydrogen ($H_2$), oxygen ($O_2$) and nitrous oxide ($N_2O$).

17 Claims, 4 Drawing Sheets

(56) References Cited

U.S. PATENT DOCUMENTS

2015/0206741 A1    7/2015   Chang
2020/0194251 A1*   6/2020   Swenberg ......... H01L 21/67115

OTHER PUBLICATIONS

GB, Combined Search and Examination Report; Intellectual Property Office; Patent Application Serial No. GB2005434.2, 6 pages (Sep. 29, 2020).

* cited by examiner

IN-SITU STEAM GENERATED OXYNITRIDE

This application claims priority to United Kingdom patent application No. 2005434.2 filed on Apr. 14, 2020, the entire contents of which are hereby incorporated by reference.

TECHNICAL FIELD

The invention relates to in-situ steam generated oxynitride.

BACKGROUND

In semiconductor gate structures, a thin oxide layer (the gate oxide) separates the gate electrode from the underlying silicon substrate. The gate oxide typically comprises silicon dioxide $SiO_2$, formed by oxidizing a silicon substrate. Nitrogen may be introduced into the oxide layer to improve performance by reducing boron penetration.

An oxide layer with nitrogen (SiON) may be formed directly in a (dry) furnace process by so called oxinitridation. The oxide is grown in an $N_2O$ environment at high pressure and a temperature in the range of 700 to 900° C.

In-situ steam generation (ISSG) is a wet oxidation technology, wherein pre-mixed $H_2$ and $O_2$ are introduced into a rapid thermal process (RTP) chamber. The gas mixture flows across a rotating wafer heated by tungsten-halogen lamps. The hot wafer ignites the reaction between $H_2$ and $O_2$ close to the wafer to form steam and thereby oxidize the wafer.

After the ISSG process, post oxidation annealing (POA) in a furnace is normally required to improve the electrical properties of the oxide layer to reach the necessary electrical specifications. Decoupled plasma nitridation (DPN) may be used post-ISSG to introduce nitrogen into the oxide layer to form a SiON layer.

SUMMARY

Aspects of the present invention provide methods of forming an oxide layer and semiconductor structures comprising an oxide layer thus formed as set out in the accompanying claims.

Certain embodiments of the invention will now be described, by way of example only, with reference to the accompanying drawings.

DETAILED DESCRIPTION

Embodiments described herein provide an ISSG process for forming an oxide layer, which can be used as a gate oxide without requiring post oxide annealing (POA) or decoupled plasma nitridation (DPN). Oxide layers thus formed can have improved electrical properties (e.g. time-dependent gate oxide breakdown, interface trap density, surface uniformity and charge density) compared to oxide layers formed by oxinitridation (or other dry oxidation processes), while also requiring less processing time to form. Compared to normal ISSG, embodiments described herein can provide oxide layers meeting the necessary electrical specifications without requiring POA. Also, compared to normal ISSG, nitrogen is introduced in the oxide layer without requiring a separate process such as DPN.

Figure 1:
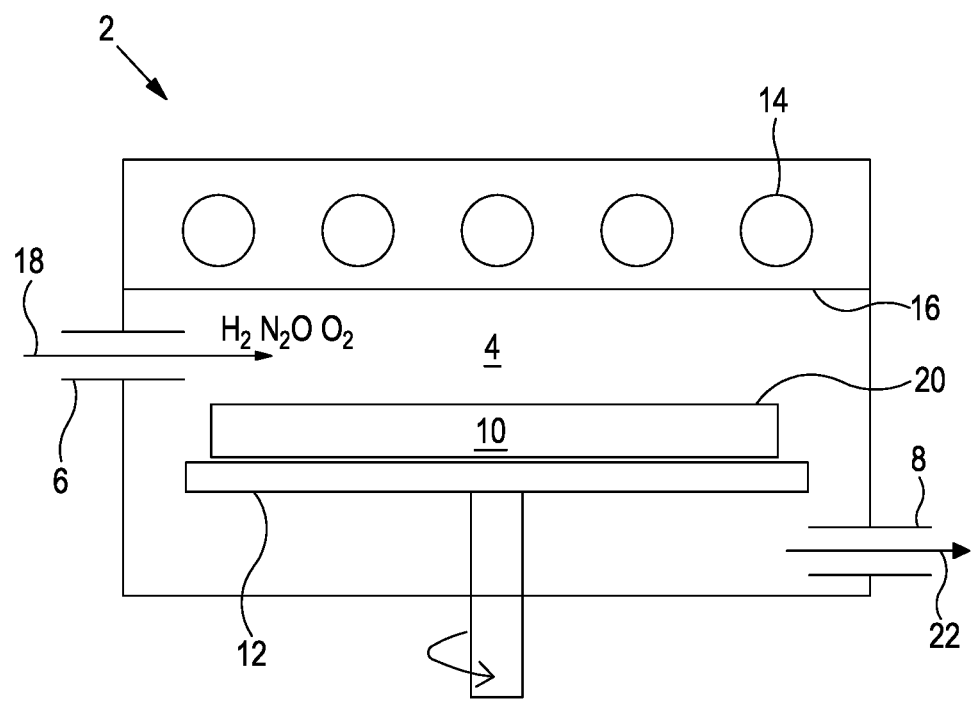
FIG. 1 shows a schematic diagram of a system for forming an oxide layer by ISSG according to an embodiment.

FIG. 1 shows a schematic diagram of a system 2 for performing in-situ steam generation (ISSG) to form an oxide layer according to an embodiment. The system 2 comprises a rapid thermal process (RTP) chamber 4 with a gas inlet 6 and a gas outlet 8. A silicon substrate 10 (e.g. a 200 mm wafer), is provided in the RTP chamber 4 on a rotatable holder 12. The system 2 further comprises heating elements 14, being light sources (e.g. halogen light bulbs), separated from the wafer 10 by a quartz window 16. In operation, to form the oxide layer, a gas mixture 18 is injected through the gas inlet 6 into the RTP chamber 4 and across the silicon substrate 10. The gas mixture 18 comprises hydrogen ($H_2$), oxygen ($O_2$) and nitrous oxide ($N_2O$). The RTP chamber is kept at a pressure in the range of 5 Torr to 9 Torr. The surface 20 of the silicon substrate 10 is heated by the heating elements 14 to a reaction temperature in the range of 1000° C. to 1100° C. The hot surface 20 ignites the gas mixture (i.e. causes the gases to react) to form steam, which oxidizes the silicon substrate 10 and thereby forms an oxide layer on the surface of the silicon substrate 10. Rest products 22 from the reaction of the gas mixture 18 are exhausted through the gas outlet 8. In one embodiment, the flow rates of $N_2O$ and $O_2$ in the gas mixture are varied during the ISSG process to improve the dielectric properties of the oxide layer that is formed. While the temperature at the surface of the silicon substrate is maintained at or above the reaction temperature, the flow rate of $N_2O$ is reduced from between 9 to 6 standard liter per minute (SLM) to between 4 to 1 SLM, and the flow rate of $O_2$ is increased from between 0.5 to 3 SLM to between 5.5 to 9 SLM in steps of between 0.5 to 2 SLM. The standard liter per minute (SLM) is a volumetric flow rate measured under reference conditions being gas temperature=0° C. and gas pressure=1 atm. An optional step can be included, where after the oxidation all the flow of the aforementioned gases is replaced by nitrogen gas ($N_2$), which may further reduce interface trap density (Dit). The temperature during this step typically remains constant, but in some embodiments can be gradually reduced. For example, while injecting the $N_2$ gas, the temperature may be decreased from a temperature above the reaction temperature to a temperature below the reaction temperature. In some other embodiments, during this step of injecting $N_2$, a noble gas like Argon (Ar) can be injected in parallel to maintain constant pressure. For example, a mixture of Ar and $N_2$ from separate gas lines with respective mass flow controls may be injected. Table 1 shows the process steps of a nitridating ISSG process according to an embodiment. The oxide layer thus formed may be a SiON layer suitable for a 1 to 1.8 V gate oxide. No annealing of the oxide layer is performed (i.e. no POA is required).

TABLE 1

ISSG process parameters

| Step | H$_2$ ratio (%) | N$_2$O flow rate (SLM) | O$_2$ flow rate (SLM) | H$_2$ flow rate (SLM) | N$_2$ flow rate (SLM) | Ar flow rate (SLM) | Temperature (° C.) | Pressure (Torr) |
|---|---|---|---|---|---|---|---|---|
| 1 | 1 to 5% | 6 to 9 | 0.5 to 3 | 0.05 to 0.3 | 0 | 0 | 1000 to 1100 | 6 to 8 |
| 2 | 1 to 5% | 5 to 8 | 1.5 to 4 | 0.05 to 0.3 | 0 | 0 | 1000 to 1100 | 6 to 8 |
| 3 | 1 to 5% | 4 to 7 | 2.5 to 5 | 0.05 to 0.3 | 0 | 0 | 1000 to 1100 | 6 to 8 |
| 4 | 1 to 5% | 3 to 6 | 3.5 to 6 | 0.05 to 0.3 | 0 | 0 | 1000 to 1100 | 6 to 8 |
| 5 | 1 to 5% | 2 to 5 | 4.5 to 7 | 0.05 to 0.3 | 0 | 0 | 1000 to 1100 | 6 to 8 |
| 6 | 1 to 5% | 1 to 4 | 5.5 to 8 | 0.05 to 0.3 | 0 | 0 | 1000 to 1100 | 6 to 8 |
| Last | 0% | 0 | 0 | 0 | 4 to 9 | 4 to 9 | 1000 to 1100 | 6 to 8 |

For example, in a specific embodiment of the ISSG process, the pressure in the RTP chamber is set to 8 Torr and the temperature in the RTP chamber is set to 1000° C. and kept constant at this temperature while injecting the gas mixture comprising H$_2$, O$_2$ and N$_2$O. The ratio of H$_2$ in the gas mixture is kept constant at 2%. The flow rate of N$_2$O of the injected gas mixture is decreased from 9 SLM to 4 SLM in steps of 0.5 SLM. The flow rate of O$_2$ is increased at the same rate (such that the total flow rate of the gas mixture remains constant) from 1 SLM to 6 SLM. After a period of 20 seconds the temperature in the RTP chamber is decreased below the reaction temperature, causing the oxidation to stop.

Figure 2:
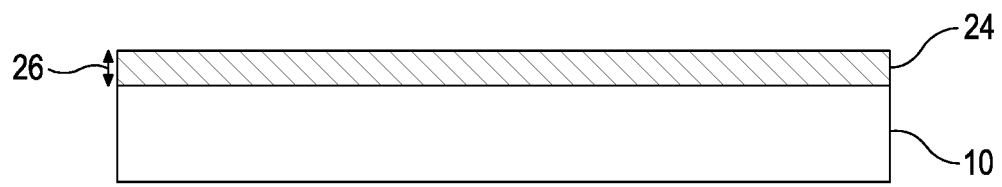
FIG. 2 shows a schematic diagram of a silicon substrate having an oxide layer formed according to an embodiment of the invention.

FIG. 2 shows a silicon substrate 10 with an oxide layer 24 formed according to an embodiment. The thickness 26 of the oxide layer is in the range of 20 A to 30 A. The oxide layer is a SiON layer (i.e. the oxide layer comprises nitrogen from the ISSG process). Further processing can be used to pattern the oxide layer 24 and to form a gate structure on the substrate, wherein the patterned oxide layer is the gate oxide layer.

Figure 3:
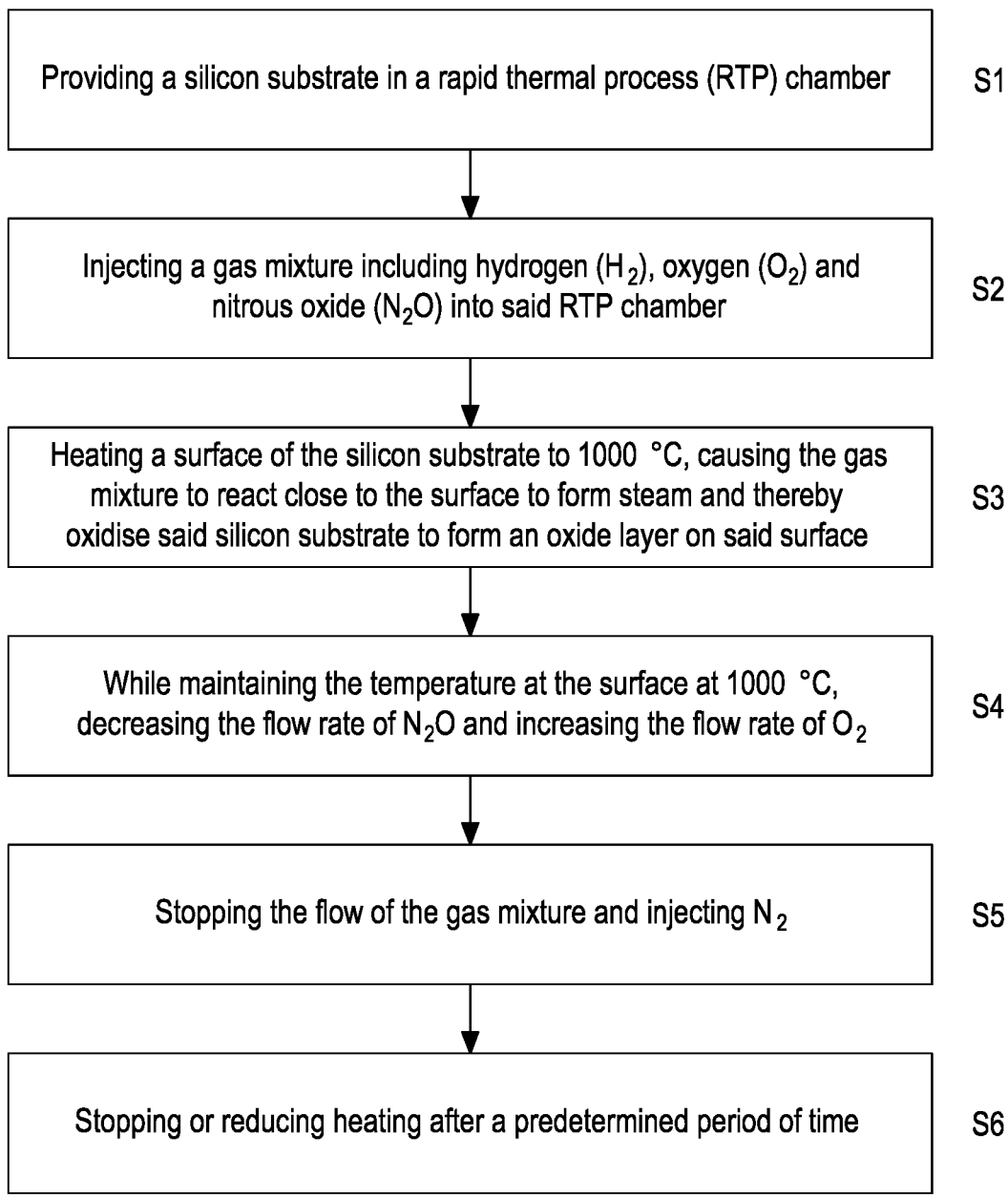
FIG. 3 shows a flow diagram illustrating the steps of a method of forming an oxide layer according to an embodiment.

FIG. 3 is a flow diagram illustrating the steps of a method of forming an oxide layer being an SiON layer according to an embodiment. The method comprises providing a silicon substrate in an RTP chamber (set S1), and injecting a gas mixture including H$_2$, O$_2$ and N$_2$O into the RTP chamber (step S2). The method further comprises heating a surface of the silicon substrate to 1000° C., causing the gas mixture to react close to the surface to form steam and thereby oxidize the silicon substrate to form the SiON layer on the surface (step S3), and while maintaining the temperature at the surface at 1000° C., decreasing the flow rate of N$_2$O and increasing the flow rate of O$_2$ (step S4). The method further comprises the optional step of stopping the flow of the gas mixture (i.e. stopping the flow of H$_2$, O$_2$ and N$_2$O) and injecting N$_2$ (step S5). The temperature during this step S5 can remain constant at 1000° C. or it can gradually be reduced. Optionally, during the step S5, a noble gas like Ar can be injected in parallel with the N$_2$ gas. The method then comprises stopping or reducing heating after a predetermined period of time (step S6).

Figure 4:
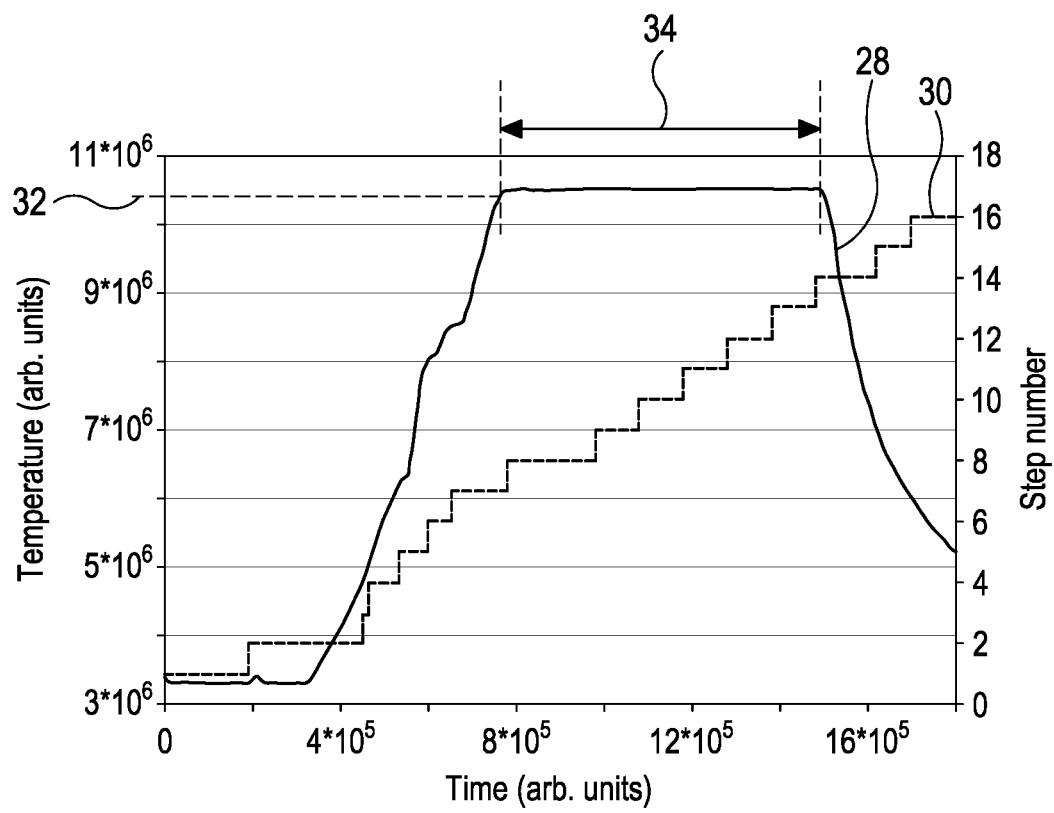
FIG. 4 shows a graph plotting temperature and oxygen flow rate against time in a method according to an embodiment.

FIG. 4 is graph of the temperature 28 of the surface of a silicon substrate and the flow rate 30 of oxygen (as part of the gas mixture) plotted against time, in the process of forming a SiON gate oxide on the silicon substrate. The temperature 28 is increased to the reaction temperature 32. The temperature 28 is maintained at or above the reaction temperature 32 for a period of time 34, during which the silicon substrate is oxidized to form an oxide layer. After the period of time 34, the temperature 28 is decreased to stop the oxidation process. The flow rate 30 of oxygen is increased at a substantially constant rate in discreet steps. During the period of time 34, at which the substrate surface is at or above the reaction temperature 32, the flow rate 30 of oxygen is increased in six or more discreet steps. FIG. 4 does not take into account the optional step (step S5) shown in FIG. 3.

In general, embodiments of the method of forming an oxide layer by ISSG comprise: Providing a silicon substrate in a rapid thermal process (RTP) chamber, injecting a gas mixture into the RTP chamber, and heating a surface of the silicon substrate to a reaction temperature, so that the gas mixture reacts close to the surface to form steam and thereby oxidize the silicon substrate to form the oxide layer on the surface. The gas mixture comprises hydrogen (H$_2$), oxygen (O$_2$) and nitrous oxide (N$_2$O). The oxide layer thus formed may be a gate oxide, such as a 1 to 1.8 V gate oxide or a 3.3 to 5 V gate oxide.

Nitrous oxide N$_2$O can be injected at a flow rate which decreases over time while the surface of the silicon substrate is at or above the reaction temperature. The flow rate of N$_2$O can be decreased in discreet steps of 0.5 to 2 SLM. That is, the flow rate of N$_2$O as part of the gas mixture may have a high value (e.g. in the range of 6 to 9 SLM) as the surface of the silicon substrate is initially heated to the reaction temperature and the gas ignites. The flow rate of N$_2$O is then decreased at a substantially constant rate while the silicon substrate is oxidized. After a period of time, the heating is stopped or reduced, causing the temperature of the surface of the substrate to fall and the steam generation/oxidation to stop. At that point, the flow rate of N$_2$O has reached a low value (e.g. in the range of 1 to 4 SLM). The oxidation can also be stopped before stopping or reducing the temperature by removing or replacing the injected gas mixture. For example, the gas mixture may be replaced by nitrogen N$_2$. After forming the oxide layer, the gas mixture can be replaced with N$_2$ injected in parallel with a noble gas (e.g. Argon).

Similarly, O$_2$ may be injected at a flow rate which increases over time while the surface of the silicon substrate is at or above the reaction temperature. The flow rate of O$_2$ is in one case increased in discreet steps of 0.5 to 2 SLM. Typically, the change in flow rate of O$_2$ and N$_2$O is synchronized so that the total flow rate of O$_2$ and N$_2$O in the gas mixture remains constant. H$_2$ may be injected at a substantially constant flow rate while the surface of the silicon substrate is at or above the reaction temperature. For example, the flow rate of H$_2$ can be about 0.05 to 0.3 SLM. The total flow rate of the gas mixture can therefore be constant during the ISSG process. The gas mixture typically comprises less than 5% hydrogen and in one case comprises below 2% hydrogen.

The reaction temperature can be in the range of 800° C. to 1100° C. and can be in the range of 1000° C. to 1100° C. for improved oxide layer surface properties. The step of heating may comprise maintaining the surface of the substrate at or above the reaction temperature for a period of time in the range of 10 to 30 seconds while injecting the gas mixture. This time period can correspond to the time during which steam generation and hence oxidation occurs, and determines at least in part the thickness of the resulting oxide layer. The pressure in the RTP chamber is typically in the range of 5 Torr to 9 Torr. The rate of oxidation depends on the pressure, which therefore also influences the thickness of the oxide layer.

Embodiments described herein can provide an oxide layer with improved dielectric and structural properties compared to other methods. For example, the uniformity of the oxide layer may be improved. Table 2 compares the surface uniformity (average thickness, standard deviation of thickness and absolute range between greatest and smallest thickness of the oxide layer) of (a) an oxide layer formed according to an embodiment of the method, (b) an oxide layer formed by furnace oxinitridation in an $N_2O$ environment, and (c) an oxide layer formed by a conventional ISSG process. The table values are derived from a full surface mapping test. As can be seen from Table 2, the oxide layer (a) formed according to an embodiment has a smaller standard deviation and a smaller range between maximum and minimum oxide thickness.

TABLE 2

| | Oxide thickness | | |
|---|---|---|---|
| Formation process | (a) $N_2O$ ISSG (SiON) | (b) Oxinitridation (SiON) | (c) Normal ISSG ($SiO_2$) |
| Average (A) | ~25.0 | ~25.0 | ~25.0 |
| Standard deviation | STD/2 | 2 * STD | STD |
| Range (A) | ~R/2 | ~2 * R | R |

Figure 5:
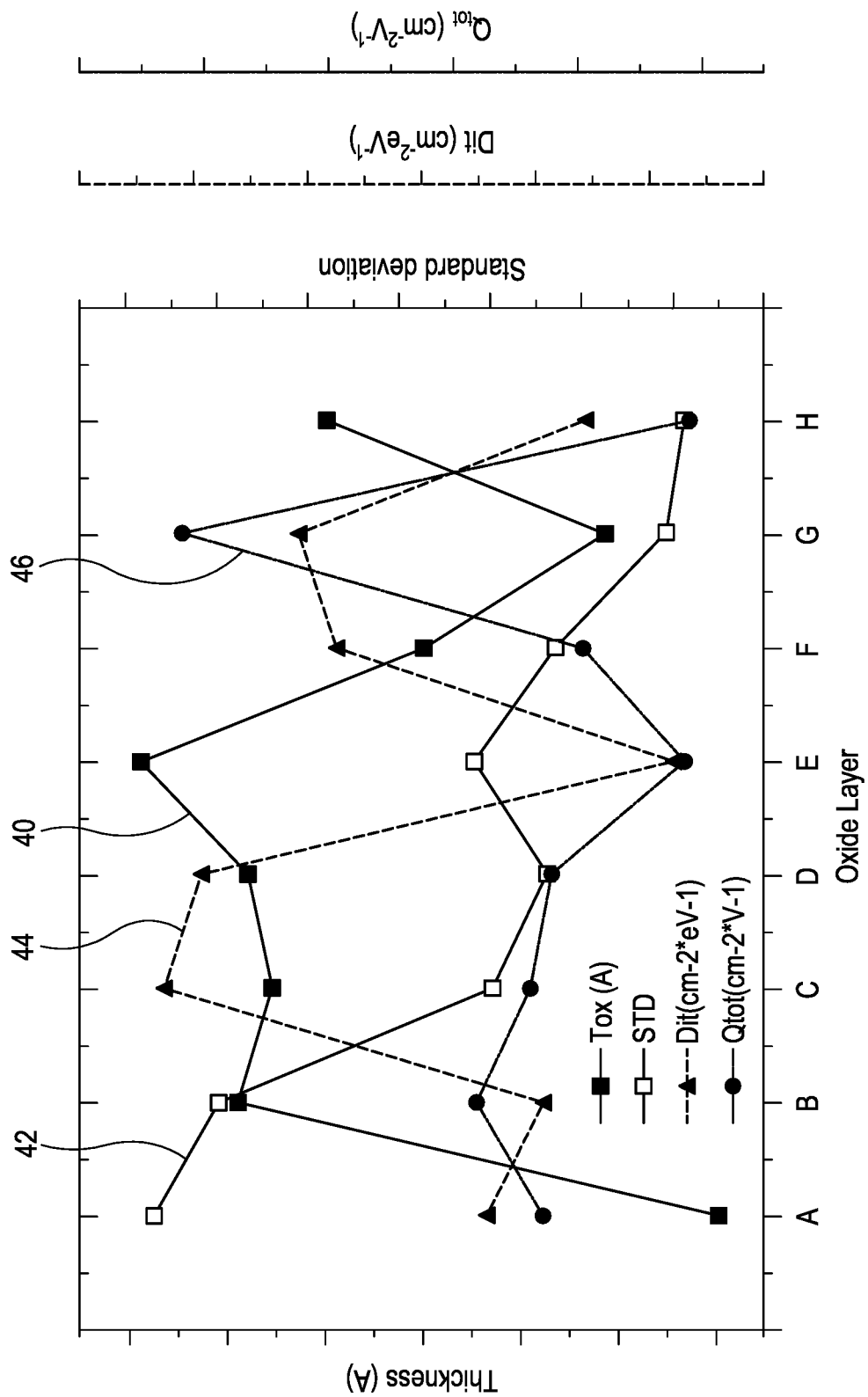
FIG. 5 shows a graph plotting different parameters of oxide layers formed by different processes.

FIG. 5 is a graph showing four parameters of eight oxide layers (A to H) formed using different methods, wherein three of the oxide layers (F, G and H) were formed by methods according to embodiments described herein. Process parameters of the eight different methods used to form the oxide layers (A to H) are given in Table 3. For the temperature of the processes presented in the table we have 800° C.<T1<T2<T3<T4<T5<1200° C., while for the pressure 7 Torr<P1<P2<P3<10 Torr. The four parameters are oxide layer thickness 40 ($T_{ox}$), standard deviation 42 (STD) of the oxide layer thickness, interface trap density 44 ($D_{it}$), and the total semiconductor charge density 46 ($Q_{tot}$).

TABLE 3

| | Process parameters of $SiO_2$ methods forming oxide layers compared in FIG. 5 | | | |
|---|---|---|---|---|
| Oxide layer | Oxide layer type | Process type | Temperature | Pressure (Torr) |
| A | SiON | Oxinitridation (furnace) | T1 | 760 |
| B | SiON | Oxinitridation (furnace) | T1 | 760 |
| C | $SiO_2$ | ISSG | T3 | P3 |
| D | $SiO_2$ | ISSG | T3 | P2 |
| E | $SiO_2$ | ISSG + POA | T3 | P2 |

TABLE 3-continued

| | Process parameters of $SiO_2$ methods forming oxide layers compared in FIG. 5 | | | |
|---|---|---|---|---|
| Oxide layer | Oxide layer type | Process type | Temperature | Pressure (Torr) |
| F | SiON | ISSG | T2 | P2 |
| G | SiON | ISSG | T4 | P2 |
| H | SiON | ISSG | T5 | P1 |

While specific embodiments of the invention have been described above, it will be appreciated that the invention may be practiced otherwise than as specifically described herein. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A method of forming an oxide layer in an in-situ steam generation (ISSG) process, comprising:
   providing a silicon substrate in a rapid thermal process (RTP) chamber;
   injecting a gas mixture comprising hydrogen ($H_2$), oxygen ($O_2$) and nitrous oxide ($N_2O$) into said RTP chamber;
   heating a surface of the silicon substrate to a reaction temperature, so that the gas mixture reacts close to said surface to form steam and thereby oxidize said silicon substrate to form an oxide layer on said surface; and
   decreasing a flow rate of said nitrous oxide in multiple discrete steps over time while said surface of the silicon substrate is at or above said reaction temperature, wherein the flow rate of $N_2O$ is decreased in discrete steps of between 0.5 to 2 SLM.

2. A method according to claim 1, wherein the flow rate of $N_2O$ is decreased from between 6 to 9 SLM to between 1 to 4 SLM.

3. A method according to claim 1, wherein the step of injecting the gas mixture comprises injecting $O_2$ at a flow rate which increases over time while said surface of the silicon substrate is at or above said reaction temperature.

4. A method according to claim 3, wherein the flow rate of $O_2$ is increased from between 0.5 to 3 SLM to between 5.5 to 9 SLM.

5. A method according to claim 3, wherein the flow rate of 02 is increased in discrete steps of between 0.5 to 2 SLM.

6. A method according to claim 1, wherein the step of injecting the gas mixture comprises injecting $H_2$ at a substantially constant flow rate while said surface of the silicon substrate is at or above said reaction temperature.

7. A method according to claim 6, wherein the flow rate of $H_2$ is in the range of 0.05 to 0.3 SLM.

8. A method according to claim 1, wherein a total flow rate of said gas mixture is constant while said surface of the silicon substrate is at or above said reaction temperature.

9. A method according to claim 1, wherein said gas mixture comprises 1% hydrogen.

10. A method according to claim 1, wherein said reaction temperature is in the range of 1000° C. to 1100° C.

11. A method according to claim 1, wherein the step of heating comprises maintaining said surface of the substrate at or above said reaction temperature for a period of time in the range of 10 to 30 seconds while injecting the gas mixture.

12. A method according to claim 1, further comprising, while injecting said gas mixture, reducing or stopping heating of said silicon surface in order to reduce the temperature of said silicon surface below the reaction temperature and thereby stop oxidation.

13. A method according to claim 1, wherein a pressure in the RTP chamber is in the range of 5 Torr to 9 Torr.

14. A method according to claim 1, wherein said pressure in the RTP chamber is in the range of 6 Torr to 8 Torr.

15. A method according to claim 1, further comprising, after forming said oxide layer, replacing said gas mixture with nitrogen ($N_2$) gas.

16. A semiconductor structure comprising a silicon substrate having an oxide layer formed according to the method of claim 1.

17. A semiconductor structure according to claim 16, wherein said semiconductor structure comprises a gate structure and said oxide layer is a gate oxide layer of said gate structure.

\* \* \* \* \*